United States Patent
Mogaveera

(10) Patent No.: US 9,170,280 B2
(45) Date of Patent: Oct. 27, 2015

(54) INDIRECT NON-CONTACT HIGH VOLTAGE MEASUREMENT ON ELECTRICAL POWER LINE

(75) Inventor: Vasu Mogaveera, Andhra Pradesh (IN)

(73) Assignee: Honeywell International Inc., Morristown, NJ (US)

( * ) Notice: Subject to any disclaimer, the term of this patent is extended or adjusted under 35 U.S.C. 154(b) by 729 days.

(21) Appl. No.: 13/237,010

(22) Filed: Sep. 20, 2011

(65) Prior Publication Data

US 2013/0069664 A1 Mar. 21, 2013

(51) Int. Cl.
*G01R 29/12* (2006.01)
*G01R 15/14* (2006.01)
*G01R 1/067* (2006.01)
*G01R 1/07* (2006.01)

(52) U.S. Cl.
CPC ............ *G01R 15/14* (2013.01); *G01R 1/06777* (2013.01); *G01R 1/06788* (2013.01); *G01R 1/07* (2013.01)

(58) Field of Classification Search
CPC ............................ G01R 15/14; G01R 1/06777
USPC ........... 324/457, 713, 600, 90, 316, 322, 347, 324/358, 415
See application file for complete search history.

(56) References Cited

U.S. PATENT DOCUMENTS

| 5,103,165 | A | | 4/1992 | Sirattz | |
|---|---|---|---|---|---|
| 5,136,234 | A | * | 8/1992 | Shaw | 324/72 |
| 5,315,232 | A | * | 5/1994 | Stewart | 324/72 |
| 5,414,344 | A | | 5/1995 | Chinn | |
| 6,118,270 | A | * | 9/2000 | Singer et al. | 324/117 R |
| 6,825,649 | B2 | | 11/2004 | Nakano | |
| 6,828,767 | B2 | | 12/2004 | Douglas | |
| 2011/0174951 | A1 | * | 7/2011 | Sander et al. | 248/339 |
| 2012/0092019 | A1 | * | 4/2012 | Blum | 324/457 |

* cited by examiner

*Primary Examiner* — Melissa Koval
*Assistant Examiner* — Trung Nguyen
(74) *Attorney, Agent, or Firm* — Wood, Phillips, Katz, Clark & Mortimer

(57) ABSTRACT

A non-contact electrical power line voltage measurement device comprises a probe including an insulated shield supporting an electrode to sense electrostatically induced voltage from the power line. The shield houses a high voltage resistor connected in series with the electrode. A meter comprises a housing operatively associated with the shield and enclosing a measurement circuit electrically connected to the high voltage resistor for measuring induced electrode voltage. A calibration circuit correlates measured electrode voltage to power line voltage. A display is driven by the measurement circuit for displaying actual power line voltage responsive to the electrode being a select distance from the power line.

20 Claims, 3 Drawing Sheets

INDIRECT NON-CONTACT HIGH VOLTAGE MEASUREMENT ON ELECTRICAL POWER LINE

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

This disclosure relates to a high voltage meter for use with electrical power lines and, more particularly, to a non-contact high voltage measurement device.

Electrical power distribution systems often include overhead electrical power distribution lines mounted upon poles by a wide variety of mounting structure. Other distribution systems include underground distribution lines in which protected cables run under the ground surface. It is often necessary to take voltage measurements of distribution and transmission lines while testing for induced or live power line or equipment.

Known high voltage safety line detectors, meters and testers comprise high resistance probes connected in series with a calibrated panel meter to read the voltage. They are designed for use as safety tools by high voltage line maintenance workers to verify the status of the line or equipment as nominal, induced or de-energized. Known devices for providing such measurements include contact type and non-contact type.

The direct high voltage measurement by contacting the live high voltage power line by using high voltage measuring and detecting equipment is often cumbersome due to distance of the power line from the ground. There are also safety concerns since voltage levels are generally more than 69 kV in an electrical power system. A non-contact type measurement technique does not require that the testing equipment directly contact the power line. However, the conventional non-contact voltage testing devices determine only the presence of a voltage on the line. They do not show the magnitude of the voltage. The approximate magnitude of the voltage is necessary to understand the voltage levels in the electrical power system.

The disclosure is directed to improvements in non-contact high voltage meters.

SUMMARY

As disclosed herein, a non-contact measurement device displays power line voltage level.

Broadly, there is disclosed herein a non-contact electrical power line voltage measurement device comprising a probe including an insulated shield supporting an electrode to sense electrostatically induced voltage from the power line. The shield houses a high voltage resistor connected in series with the electrode. A meter comprises a housing operatively associated with the shield and enclosing a measurement circuit electrically connected to the high voltage resistor for measuring induced electrode voltage. A calibration circuit correlates measured electrode voltage to power line voltage. A display is driven by the measurement circuit for displaying actual power line voltage responsive to the electrode being a select distance from the power line.

It is a feature that a handle portion is integrally formed with the housing. A hot stick may be selectively attached to the housing.

The measurement circuit may comprise a micro-ammeter circuit.

It is a feature that the calibration circuit comprises a resistor having a value correlated to a particular line voltage at a preselect distance.

It is another feature that the calibration circuit comprises a variable resistor having a value selectively correlated to a particular line voltage at a pre-select distance or a preselect line voltage at a particular distance.

The variable resistor may have a value selectively correlated to one of a plurality of power line voltages at a preselect distance. Alternatively, the variable resistor may have a value selectively correlated to one of a plurality of power line voltages at a first select distance or one of another plurality of power line voltages at a second preselect distance, and one of a further plurality of power line voltages at a third preselect distance.

It is another feature to provide an insulated hook having a length of the select distance.

There is also disclosed herein a portable non-contact electrical power line voltage measurement device comprising a probe including an elongate insulated shield connected to a handle portion at a near end and an electrode at an opposite distal end to sense electrostatically induced voltage from the power line. A meter housing is operatively associated with the probe. An electrical circuit comprises a high voltage resistor connected in series with the electrode. A measurement circuit connected to the high voltage resistor measures induced electrode voltage. A calibration circuit correlates measured electrode voltage to power line voltage and a display in the meter housing is driven by the measurement circuit for displaying actual power line voltage responsive to the electrode being a select distance from the power line.

Other features and advantages will be apparent from a review of the entire specification, including the appended claims and drawings.

DETAILED DESCRIPTION

Figure 1:
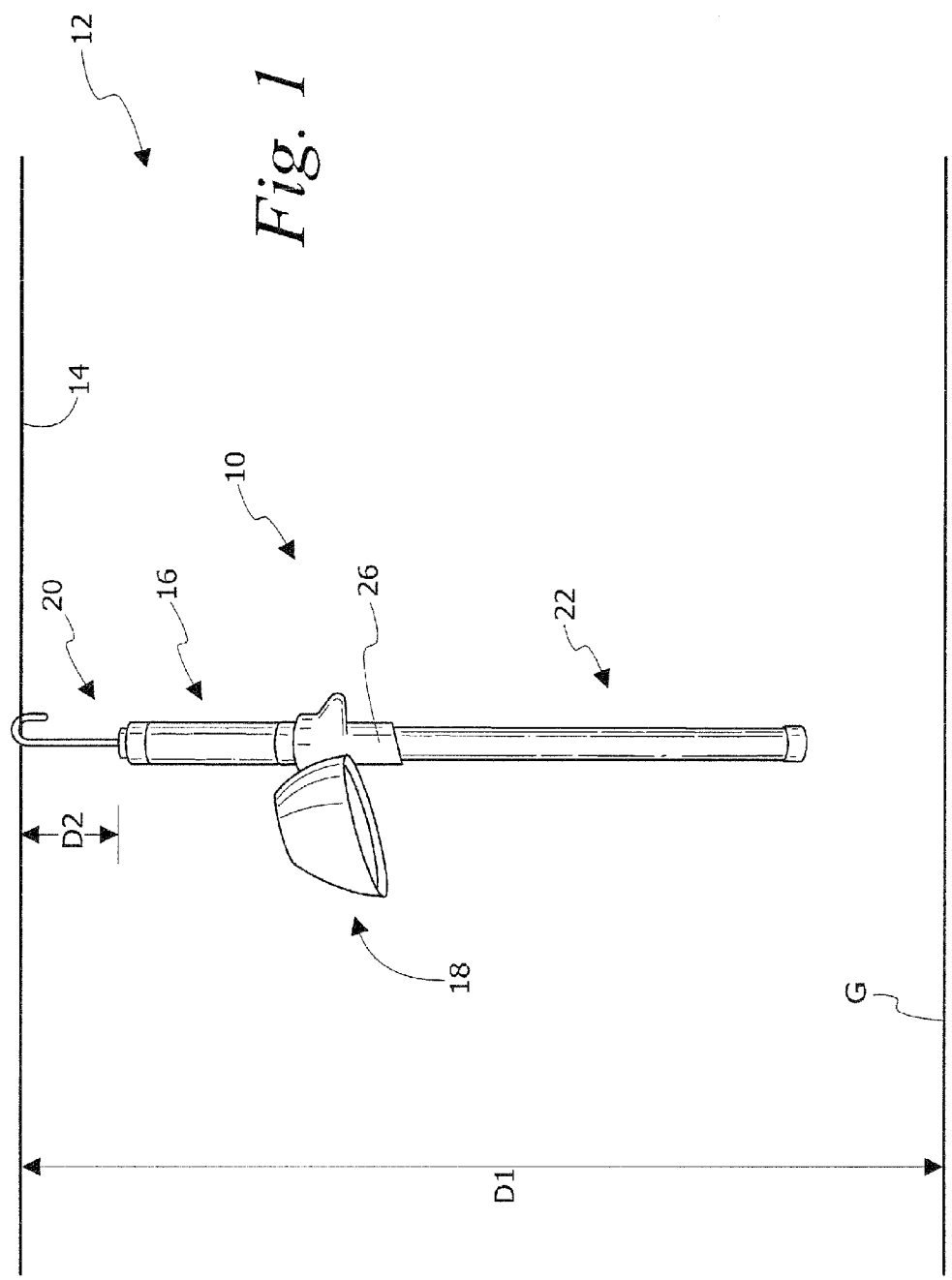
FIG. 1 is a perspective view of a portable non-contact electrical power line voltage measurement device for measuring or indicating power line voltage.

Referring initially to FIG. 1, a portable non-contact electrical power line voltage measurement device 10 is shown for measuring voltage level in a power line distribution and transmission system 12. The distribution and transmission line system 12 includes plural distribution and transmission lines in the form of power lines, one of which 14 is shown, for carrying high voltage AC power. The power line 14 is spaced a select distance D1 from a ground surface G such as by being mounted on an electrical pole or tower, or the like. The voltage meter 10 is adapted to measure voltage on the power line 14 while spaced a select distance D2 from the power line 14. The distance D2 can be maintained physically by using an insulating element of the select length D2 as part of the measurement device 10, as described below.

Figure 2:
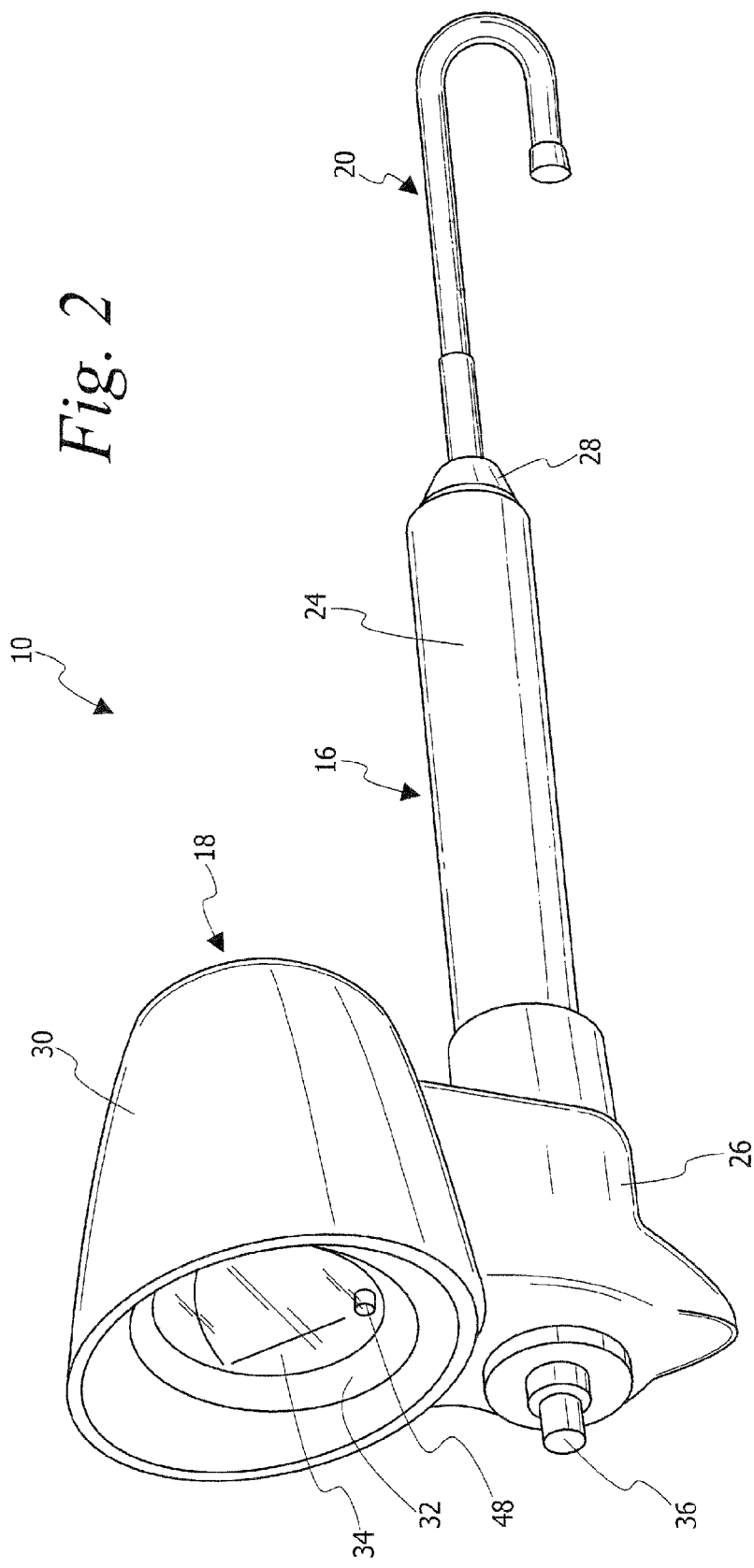
FIG. 2 is a side perspective view of the measurement device.

Referring also to FIG. 2, the measurement device 10 comprises a probe 16, a meter 18, an insulating hook 20 and a hot stick 22, see FIG. 1. The hot stick 22 is for extending length of the measurement device 10, as is conventional. The insulating hook 20 will be of a select length D2 depending on the voltage level being measured.

The probe 16 comprises an elongate cylindrical insulated shield 24 connected to a handle portion 26 at a near end and a terminal 28, acting as an electrode, at a distal end. The terminal 28 is adapted to threadably receive the insulating hook 20. The meter 18 comprises a housing 30 integrally formed with the handle portion 26. The housing 30 is frustoconical in shape including a bottom bezel 32 through which a display 34 is visible. The display 34 can be an analog display as shown or a digital display, as preferred. An adaptor 36 on the handle portion 26 is aligned with the shield 24 and is adapted to secure the hot stick 22 in a conventional manner.

In use the measurement device 10 is held a preselect distance from the power line 14. This is done by inserting an insulated hook 20 of the desired length on the probe 16. The measurement device 10 is extended, by gripping the hot stick 22, to place the hook 20 over the power line 14. An approximation of actual power line voltage will be displayed on the display 34.

As is known, an electrical field & potential is governed by Gauss' law & Laplace equations. Electric field due to an isolated conducting sphere in a free space is:

$$E = (q/4*pi*epsilon*x^2) V/m$$

Where, q is the total charge on the surface of the sphere under application of the voltage, represented in coulombs. Epsilon is the dielectric constant of the insulating materials. It is equal to 8.854 e-12 farad/meter and permittivity of the materials. For air permittivity=1.

r=radius of the sphere, given in millimeters. 'x' is the distance from the sphere to any given reference point, also given in millimeters.

Electric potential is determined by:

$$V = (q/4*pi*epsilon*x) \text{Volts.}$$

The total charge on the surface of the sphere is given by:

$$q = V*4*pi*epsilon*r, \text{ thus } q = V*4*pi*\text{permittivity constant}*\text{permittivity}*r$$

If V=1 volt, the radius of sphere is 1 mm, and permittivity=1 (air on the surface of the sphere), then q=1*4*3.1414*8.854 e-12*1*1 e-3=1.11 e-13 C.

Once charge is calculated, then the electric field and potential at various points can be determined.

As an example, if the radius of a sphere is 5 mm, then Charge q=1*4*3.1414*8.854 e-12*5*1 e-3=5.55 e-13 C.

At 100 kV, the total charge for an applied voltage of 100 kV is given by q=5.55 e-8 C for the sphere radius of 5 mm (diameter 10 mm). Once the charge on the conductor is known, then the electric field and potential can be calculated at various points or locations between the line and ground surface. In a theoretical analysis, the conducting sphere potential computation can be applied to a high voltage line cross section. The high voltage line electric field computation can be simulated using electric field simulation software and can thus determine the potential at various points between the high voltage line and ground.

Potential at various points from the high voltage line to ground, as shown in FIG. 1, for different voltage lines, based on the approximate voltage computation using the conductive sphere, are shown in the table below (In the table the electrostatically induced voltage for a particular line is labeled "Line IV"). For example at 1000 mm distance for an 100 kV line, the electrostatically induced voltage is 498 volts and similarly for a 700 kV line the electrostatically induced voltage is 3.49 kV.

| SI no. | Distance D2 (mm) | 50 kV Line IV (kV) | 100 kV Line IV (kV) | 200 kV Line IV (kV) | 300 kV Line IV (kV) | 400 kV Line IV (kV) | 500 kV Line IV (kV) | 600 kV Line IV (kV) | 700 kV Line IV (kV) |
|---|---|---|---|---|---|---|---|---|---|
| 1 | 50 | 4.535 | 9.07 | 18.14 | 27.21 | 36.28 | 45.35 | 54.42 | 63.49 |
| 2 | 100 | 2.375 | 4.75 | 9.5 | 14.25 | 19 | 23.75 | 28.5 | 33.25 |
| 3 | 150 | 1.605 | 3.21 | 6.42 | 9.63 | 12.84 | 16.05 | 19.26 | 22.47 |
| 4 | 200 | 1.215 | 2.43 | 4.86 | 7.29 | 9.72 | 12.15 | 14.58 | 17.01 |
| 5 | 250 | 0.978 | 1.956 | 3.912 | 5.868 | 7.824 | 9.78 | 11.736 | 13.692 |
| 6 | 300 | 0.82 | 1.64 | 3.28 | 4.92 | 6.56 | 8.2 | 9.84 | 11.48 |
| 7 | 350 | 0.7 | 1.4 | 2.8 | 4.2 | 5.6 | 7 | 8.4 | 9.8 |
| 8 | 400 | 0.615 | 1.23 | 2.46 | 3.69 | 4.92 | 6.15 | 7.38 | 8.61 |
| 9 | 450 | 0.548 | 1.096 | 2.192 | 3.288 | 4.384 | 5.48 | 6.576 | 7.672 |
| 10 | 500 | 0.493 | 0.987 | 1.974 | 2.961 | 3.948 | 4.935 | 5.922 | 6.909 |
| 11 | 550 | 0.442 | 0.899 | 1.798 | 2.697 | 3.596 | 4.495 | 5.394 | 6.293 |
| 12 | 600 | 0.412 | 0.824 | 1.648 | 2.472 | 3.296 | 4.12 | 4.944 | 5.768 |
| 13 | 700 | 0.356 | 0.712 | 1.424 | 2.136 | 2.848 | 3.56 | 4.272 | 4.98 |
| 14 | 800 | 0.311 | 0.623 | 1.246 | 1.869 | 2.492 | 3.11 | 3.738 | 4.36 |
| 15 | 900 | 0.277 | 0.554 | 1.1 | 1.662 | 2.216 | 2.77 | 3.324 | 3.88 |
| 16 | 1000 | 0.249 | 0.498 | 0.996 | 1.494 | 1.992 | 2.49 | 2.99 | 3.49 |
| 17 | 5000 | 0.046 | 0.099 | 0.198 | 0.297 | 0.396 | 0.495 | 0.594 | 0.693 |
| 18 | 10000 | 0.024 | 0.048 | 0.096 | 0.144 | 0.192 | 0.24 | 0.288 | 0.336 |
| 19 | 20000 | 0.012 | 0.024 | 0.048 | 0.072 | 0.096 | 0.12 | 0.144 | 0.168 |
| 20 | 30000 | 0.008 | 0.017 | 0.034 | 0.051 | 0.068 | 0.085 | 0.102 | 0.119 |

As described herein, the measurement device 10 measures electrostatically induced voltage from the power line. The measurement is based on the probe 16 with a high voltage resistor sensing induced voltage. With the electrode 28 being a preselect distance from the line 14, based on length of the insulated hook 20, the measurement device 10 will display an approximation of the actual power line voltage that the meter is calibrated for. Thus, if the measurement device 10 is calibrated for a 100 kV line, and the terminal 28 is at the preselect distance of 1000 mm from the power line 14, then the electrostatically induced voltage measured is 498 volts but the display 34 will display 100 kV.

Figure 3:
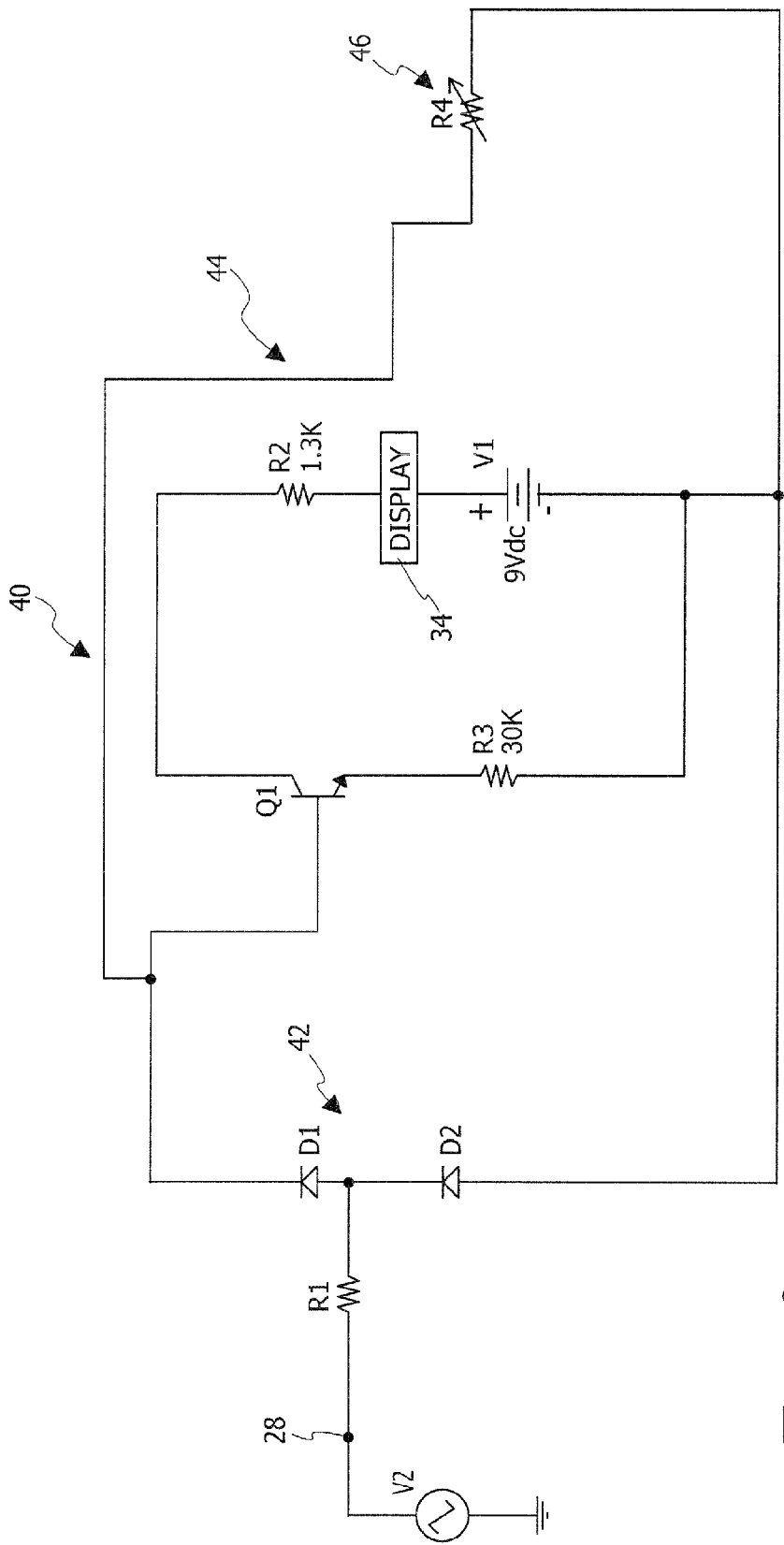
FIG. 3 is an electrical schematic of the measurement device.

Referring to FIG. 3, an electrical circuit 40 is shown for the measurement device 10. The electrical circuit 40 uses the micro-ammeter method for measuring voltage. As will be apparent, other techniques for measuring voltage could also be used.

The circuit 40 includes a high voltage resistor R1. The high voltage resistor R1 is located in the probe 16, particularly within the shield 24, and is electrically connected in series with the electrode 28. The voltage V2 represents induced voltage that will be measured by the circuit 40. The electrical circuit will display actual line voltage responsive thereto.

The electrical circuit 40 includes a rectifier circuit 42 comprising diodes D1 and D2 connected to the high voltage resistor R1. The electrical circuit 40 is powered by a battery V1. The battery V1 powers a measurement circuit 44 for measuring induced electrode voltage. The measurement circuit 44 comprises a transistor Q1 having a base connected to the rectifier circuit 42. Resistor R3 is connected to the emitter. The collector in connected to a resistor R2 which is connected in series with the display 34 and the bathe V1. A calibration circuit 46 comprises a resistor R4 connected across the rectifier circuit 42.

The electrical circuit 40 is adapted to measure the induced voltage at the electrode 28. The electrode 28 will be positioned at a point a preselect distance from the high voltage line with the circuit 40 calibrated to actual voltage of the line. This schematic is adapted to use non-direct approximate voltage measurement at one particular distance. In one example, and using the table above, the circuit 40 may be calibrated for a 700 kV line at a particular distance, such as 1,000 mm. As noted from the table above, if the electrode 28 is placed 1,000 mm from a 700 kV line, then the measured voltage will be 3.49 kV. However, the display 34 will show 700 kV.

Particularly, the calibration circuit 46 correlates measured electrode voltage to power line voltage. This is done by appropriately selecting value of the resistor R4. The resistor R4 may be of a select value correlated to a particular line voltage at a preselect distance. Alternatively, the resistor R4 may be a variable resistor, as shown, having a value selectively correlated to a particular line voltage at a preselect distance or a preselect line voltage at a particular distance. As such, the resistor R4 could be varied so that the measurement device 10 is used with only one particular line voltage but the resistance can be changed to vary the preselect distance. Alternatively, the measurement device can be used so that it is used a particular distance for any line voltage and a line voltage to be measured is selected by varying the resistance R4. These values would be empirically determined and the operation would need to be understood by the user. Additionally, the meter housing 30 could include a knob 48, see FIG. 2, for selecting the resistance value and include the appropriate gradation markers. Alternatively, the knob 40 could actuate a selector switch connected to a plurality of individual resistors for selecting resistance value.

The measurement device 10 can also be used at variable distances from a set of high voltage lines based on magnitudes of the electrostatically induced voltage from the different high voltage lines and adjustment of the calibration circuit 46. For example, the different distances could be calculated for a first set of high voltage lines between 1 kV and 25 kV at one distance value, a second set of high voltage lines between 25 kV to 300 kV at a second distance value and a third set of high voltage lines between 300 kV to 800 kV at a third distance value. In such an application, the user would need to know the particular distance value for the range and then use the variable resistor R4 to select the particular high voltage line to be measured at that preselect distance.

Thus, by using the measurement device 10, a voltage detection method is possible that gives approximate voltage magnitude with a tolerance of plus or minus 20% with a high voltage power line at any given distance from the line to ground surface based on the measurement circuit calibration. Calibration is done by first computing voltage at various points from the high voltage line to ground using the mathematical formulas as noted above. The measurement circuit is then designed to calibrate for the various voltage levels for the various distances and voltage mode selections for the various levels at the particular distances. This provides for simple voltage detection at any distance from the line to ground and at any rating of voltage line at any distance. This increases the personal safety for voltage measurement and allows higher voltages on the order of 700 kV to be measured with a non-complicated insulated design. Equipment safety is ensured since there is no contact with the power line.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

The invention claimed is:

1. A non-contact electrical power line voltage measurement device comprising:
   a probe including an insulated shield supporting an electrode to sense electrostatically induced voltage from the power line, the shield housing a high voltage resistor connected in series with the electrode; and
   a meter comprising a housing operatively associated with the shield and enclosing a measurement circuit electrically connected to the high voltage resistor for measuring induced electrode voltage, a calibration circuit for correlating measured electrode voltage to power line voltage and a display driven by the measurement circuit for displaying actual power line voltage responsive to the electrode being a select distance from the power line.

2. The non-contact electrical power line voltage measurement device of claim 1 further comprising a handle portion integrally formed with the housing.

3. The non-contact electrical power line voltage measurement device of claim 1 further comprising a hot stick selectively attached to the housing.

4. The non-contact electrical power line voltage measurement device of claim 1 wherein the measurement circuit comprises a micro-ammeter circuit.

5. The non-contact electrical power line voltage measurement device of claim 1 wherein the calibration circuit comprises a resistor having a value correlated to a particular line voltage at a preselect distance.

6. The non-contact electrical power line voltage measurement device of claim 1 wherein the calibration circuit comprises a variable resistor having a value selectively correlated to a particular line voltage at a preselect distance.

7. The non-contact electrical power line voltage measurement device of claim 1 wherein the calibration circuit comprises a variable resistor having a value selectively correlated to a preselect line voltage at a particular distance.

8. The non-contact electrical power line voltage measurement device of claim 1 wherein the calibration circuit comprises a variable resistor having a value selectively correlated to one of a plurality of power line voltages at a preselect distance.

9. The non-contact electrical power line voltage measurement device of claim 8 wherein the variable resistor has a value selectively correlated to one of a plurality of power line voltages at a first preselect distance, one of another plurality of power line voltages at a second preselect distance, and one of a further plurality of power line voltages at a third preselect distance.

10. The non-contact electrical power line voltage measurement device of claim 1 further comprising an insulated hook having a length of the select distance.

11. A portable non-contact electrical power line voltage measurement device comprising:
a probe including an elongate insulated shield connected to a handle portion at a near end and an electrode at an opposite distal end to sense electrostatically induced voltage from the power line;
a meter housing operatively associated with the probe; and
an electrical circuit comprising a high voltage resistor connected in series with the electrode, a measurement circuit connected to the high voltage resistor for measuring induced electrode voltage, a calibration circuit for correlating measured electrode voltage to power line voltage and a display in the meter housing driven by the measurement circuit for displaying actual power line voltage responsive to the electrode being a select distance from the power line.

12. The portable non-contact electrical power line voltage measurement device of claim 11 wherein the handle portion is integrally formed with the housing.

13. The portable non-contact electrical power line voltage measurement device of claim 11 further comprising a hot stick selectively attached to the housing.

14. The portable non-contact electrical power line voltage measurement device of claim 11 wherein the measurement circuit comprises a micro-ammeter circuit.

15. The portable non-contact electrical power line voltage measurement device of claim 11 wherein the calibration circuit comprises a resistor having a value correlated to a particular line voltage at a preselect distance.

16. The portable non-contact electrical power line voltage measurement device of claim 11 wherein the calibration circuit comprises a variable resistor having a value selectively correlated to a particular line voltage at a preselect distance.

17. The portable non-contact electrical power line voltage measurement device of claim 11 wherein the calibration circuit comprises a variable resistor having a value selectively correlated to a preselect line voltage at a particular distance.

18. The portable non-contact electrical power line voltage measurement device of claim 11 wherein the calibration circuit comprises a variable resistor having a value selectively correlated to one of a plurality of power line voltages at a preselect distance.

19. The portable non-contact electrical power line voltage measurement device of claim 18 wherein the variable resistor has a value selectively correlated to one of a plurality of power line voltages at a first preselect distance one of another plurality of power line voltages at a second preselect distance, and one of a further plurality of power line voltages at a third preselect distance.

20. The portable non-contact electrical power line voltage measurement device of claim 11 further comprising an insulated hook having a length of the select distance.

* * * * *